(12) United States Patent
Kalkan et al.

(10) Patent No.: US 7,341,774 B2
(45) Date of Patent: *Mar. 11, 2008

(54) ELECTRONIC AND OPTO-ELECTRONIC DEVICES FABRICATED FROM NANOSTRUCTURED HIGH SURFACE TO VOLUME RATIO THIN FILMS

(75) Inventors: Ali Kaan Kalkan, State College, PA (US); Stephen J. Fonash, State College, PA (US)

(73) Assignee: The Penn State Research Foundation, University Park, PA (US)

( * ) Notice: Subject to any disclaimer, the term of this patent is extended or adjusted under 35 U.S.C. 154(b) by 240 days.

This patent is subject to a terminal disclaimer.

(21) Appl. No.: 11/080,066

(22) Filed: Mar. 14, 2005

(65) Prior Publication Data

US 2006/0057354 A1  Mar. 16, 2006

Related U.S. Application Data

(63) Continuation-in-part of application No. 10/165,858, filed on Jun. 8, 2002, now Pat. No. 6,919,119, and a continuation-in-part of application No. 10/144,456, filed on May 13, 2002, which is a continuation-in-part of application No. 10/104,749, filed on Mar. 22, 2002, which is a continuation of application No. 09/580,105, filed on May 30, 2000, now Pat. No. 6,399,177.

(60) Provisional application No. 60/296,857, filed on Jun. 8, 2001.

(51) Int. Cl.
*B32B 7/00* (2006.01)

(52) U.S. Cl. .......................... 428/119; 977/720; 977/932

(58) Field of Classification Search ................ 428/119
See application file for complete search history.

(56) References Cited

U.S. PATENT DOCUMENTS 3,037,122 A  5/1962  Strother (Continued)

FOREIGN PATENT DOCUMENTS

DE  2741954  3/1979

(Continued)

OTHER PUBLICATIONS

Alivisatos, "Naturally Aligned Nanocrystals," Science 289, p. 736 (2000).

(Continued)

*Primary Examiner*—G. Blackwell
(74) *Attorney, Agent, or Firm*—Burns & Levinson LLP; Orlando Lopez

(57) ABSTRACT

An electronic or opto-electronic device or a chemical sensor comprising: an interpenetrating network of a nanostructured high surface area to volume ratio film material and an organic/inorganic material forming a nanocomposite. The high surface area to volume film material is obtained onto an electrode substrate first, such that the nano-scale basic elements comprising this film material are embedded in a void matrix while having electrical connectivity with the electrode substrate. For example, the film material may comprise an array of nano-protrusions electrically connected to the electrode substrate and separated by a void matrix. The interpenetrating network is formed by introducing an appropriate organic/inorganic material into the void volume of the high surface area to volume film material. Further electrode(s) are defined onto the film or intra-void material to achieve a certain device. Charge separation, charge injection, charge storage, field effect devices, ohmic contacts, and chemical sensors are possible.

19 Claims, 3 Drawing Sheets

U.S. PATENT DOCUMENTS

| | | |
|---|---|---|
| 3,069,487 A | 12/1962 | Strother |
| 3,206,831 A | 9/1965 | Strother |
| 3,206,832 A | 9/1965 | Strother |
| 3,679,949 A | 7/1972 | Uekusa et al. |
| 3,969,163 A | 7/1976 | Wakefield |
| 3,984,256 A | 10/1976 | Fletcher et al. |
| 4,080,488 A | 3/1978 | Chen et al. |
| 4,385,102 A | 5/1983 | Fitzky et al. |
| 4,436,558 A | 3/1984 | Russak |
| 4,492,743 A | 1/1985 | Howe |
| 4,684,537 A | 8/1987 | Graetzel et al. |
| 4,872,925 A | 10/1989 | McMaster |
| 4,913,744 A | 4/1990 | Hoegl et al. |
| 4,927,721 A | 5/1990 | Gratzel et al. |
| 5,084,365 A | 1/1992 | Gratzel et al. |
| 5,178,685 A | 1/1993 | Borenstein et al. |
| 5,260,957 A | 11/1993 | Hakimi et al. |
| 5,293,050 A | 3/1994 | Chapple-Sokol et al. |
| 5,331,183 A | 7/1994 | Sariftci et al. |
| 5,350,644 A | 9/1994 | Graetzel et al. |
| 5,354,707 A | 10/1994 | Chapple-Sokol et al. |
| 5,385,614 A | 1/1995 | Albright et al. |
| 5,422,489 A | 6/1995 | Bhargava |
| 5,437,736 A | 8/1995 | Cole |
| 5,441,827 A | 8/1995 | Gratzel et al. |
| 5,454,879 A | 10/1995 | Bolger |
| 5,454,880 A | 10/1995 | Sariftci et al. |
| 5,463,057 A | 10/1995 | Graetzel et al. |
| 5,482,570 A | 1/1996 | Saurer et al. ............... 136/255 |
| 5,505,928 A | 4/1996 | Alivisatos et al. |
| 5,525,440 A | 6/1996 | Kay et al. .................. 429/111 |
| 5,569,561 A | 10/1996 | Exnar et al. |
| 5,571,612 A | 11/1996 | Motohiro et al. .......... 428/323 |
| 5,585,640 A | 12/1996 | Huston et al. |
| 5,613,140 A | 3/1997 | Taira |
| 5,637,156 A | 6/1997 | Kubota et al. ............. 136/251 |
| 5,641,362 A | 6/1997 | Meier |
| 5,674,325 A | 10/1997 | Albright et al. ............ 136/250 |
| 5,690,807 A | 11/1997 | Clark, Jr. et al. |
| 5,728,487 A | 3/1998 | Gratzel et al. |
| 5,751,018 A | 5/1998 | Alivisatos et al. |
| 5,789,592 A | 8/1998 | Gratzel et al. |
| 5,830,597 A | 11/1998 | Hoffmann et al. .......... 429/111 |
| 5,881,083 A | 3/1999 | Diaz-Garcia et al. |
| 5,885,368 A | 3/1999 | Lupo et al. |
| 5,897,945 A | 4/1999 | Lieber et al. |
| 5,902,416 A | 5/1999 | Kern et al. |
| 5,906,004 A | 5/1999 | Lebby et al. |
| 5,986,206 A | 11/1999 | Kambe et al. .............. 136/263 |
| 5,990,415 A | 11/1999 | Green et al. ................ 136/255 |
| 5,990,479 A | 11/1999 | Weiss et al. |
| 5,997,832 A | 12/1999 | Lieber et al. |
| 6,013,871 A | 1/2000 | Curtin |
| 6,024,807 A | 2/2000 | Pappas et al. |
| 6,036,774 A | 3/2000 | Lieber et al. |
| 6,043,428 A | 3/2000 | Han et al. |
| 6,048,616 A | 4/2000 | Gallagher et al. |
| 6,067,184 A | 5/2000 | Bonhote et al. |
| 6,067,313 A | 5/2000 | Cafarella et al. |
| 6,069,313 A | 5/2000 | Kay ............................ 136/249 |
| 6,075,203 A | 6/2000 | Wang et al. ................. 136/256 |
| 6,080,690 A | 6/2000 | Lebby et al. |
| 6,084,176 A | 7/2000 | Shiratsuchi et al. |
| 6,121,540 A | 9/2000 | Takeda et al. |
| 6,130,378 A | 10/2000 | Hatano et al. |
| 6,136,156 A | 10/2000 | El-Shall et al. |
| 6,175,075 B1 | 1/2001 | Shiotsuka et al. |
| 6,225,198 B1 | 5/2001 | Alivisatos et al. |
| 6,232,547 B1 | 5/2001 | Meissner et al. |
| 6,239,355 B1 | 5/2001 | Salafsky |
| 6,245,988 B1 | 6/2001 | Gratzel et al. |
| 6,270,846 B1 | 8/2001 | Brinker et al. ............ 427/385.5 |
| 6,278,056 B1 | 8/2001 | Sugihara et al. ............. 136/263 |
| 6,281,429 B1 | 8/2001 | Takada et al. |
| 6,288,324 B1 | 9/2001 | Komori et al. |
| 6,288,325 B1 | 9/2001 | Jansen et al. |
| 6,288,326 B1 | 9/2001 | Hayashi et al. |
| 6,291,763 B1 | 9/2001 | Nakamura .................. 136/256 |
| 6,306,736 B1 | 10/2001 | Alivisatos et al. |
| 6,310,282 B1 | 10/2001 | Sakurai et al. |
| 6,322,901 B1 | 11/2001 | Bawendi et al. |
| 6,335,480 B1 | 1/2002 | Bach et al. |
| 6,340,789 B1 | 1/2002 | Petritsch et al. ............. 136/263 |
| 6,350,946 B1 | 2/2002 | Miyake et al. .............. 136/252 |
| 6,376,765 B1 | 4/2002 | Wariishi et al. .............. 136/263 |
| 6,384,321 B1 | 5/2002 | Mikoshiba et al. |
| 6,413,489 B1 | 7/2002 | Ying et al. |
| 6,426,827 B1 | 7/2002 | Bonhote et al. |
| 6,501,091 B1 | 12/2002 | Bawendi et al. |
| 6,919,119 B2 * | 7/2005 | Kalkan et al. .............. 428/119 |
| 2001/0004901 A1 | 6/2001 | Yamanaka et al. .......... 136/263 |
| 2001/0032665 A1 | 10/2001 | Han et al. |
| 2001/0046244 A1 | 11/2001 | Klimov et al. |
| 2002/0017656 A1 | 2/2002 | Graetzel et al. ............. 257/184 |
| 2002/0040728 A1 | 4/2002 | Yoshikawa .................. 136/263 |
| 2002/0071952 A1 | 6/2002 | Bawendi et al. |
| 2002/0130311 A1 | 9/2002 | Lieber et al. |
| 2002/0134426 A1 | 9/2002 | Chiba et al. ................. 136/263 |
| 2002/0172820 A1 | 11/2002 | Majumdar et al. |
| 2002/0192441 A1 | 12/2002 | Kalkan et al. .............. 428/209 |
| 2003/0056821 A1 | 3/2003 | Chittibabu et al. ......... 136/250 |
| 2003/0102024 A1 | 6/2003 | Zeira ........................... 136/263 |
| 2003/0127130 A1 | 7/2003 | Murai et al. ................. 136/263 |
| 2003/0142944 A1 | 7/2003 | Sundar et al. |
| 2003/0145779 A1 | 8/2003 | Alivisatos et al. ............ 117/2 |
| 2003/0226498 A1 | 12/2003 | Alivisatos et al. ........... 117/84 |
| 2004/0003838 A1 | 1/2004 | Curtin ......................... 136/250 |
| 2004/0084080 A1 | 5/2004 | Sager et al. ................. 136/263 |
| 2004/0095658 A1 | 5/2004 | Buretea et al. .............. 359/853 |
| 2004/0109666 A1 | 6/2004 | Kim .......................... 385/147 |
| 2004/0118448 A1 | 6/2004 | Scher et al. ................. 136/252 |
| 2004/0146560 A1 | 7/2004 | Whiteford et al. .......... 424/484 |
| 2004/0178390 A1 | 9/2004 | Whiteford et al. ......... 252/500 |

FOREIGN PATENT DOCUMENTS

| | | |
|---|---|---|
| DE | 4221084 | 1/1994 |
| DE | 9308513 | 1/1994 |
| EP | 0739020 | 10/1996 |
| EP | 0901175 | 10/1999 |
| EP | 1028475 | 8/2000 |
| EP | 1087446 | 3/2001 |
| EP | 1089305 | 4/2001 |
| JP | 55-125681 | 9/1980 |
| JP | 59-125670 | 7/1984 |
| JP | 59-144177 | 8/1984 |
| JP | 2000-294306 | 10/2000 |
| WO | WO 91/16719 | 10/1991 |
| WO | WO 94/00887 | 1/1994 |
| WO | WO 94/04497 | 3/1994 |
| WO | WO 95/29924 | 11/1995 |
| WO | WO 96/10282 | 4/1996 |
| WO | WO 96/29715 | 9/1996 |
| WO | WO 02/17362 | 2/2002 |
| WO | WO 02/080280 | 10/2002 |
| WO | WO 02/084708 | 10/2002 |
| WO | WO 03/054953 | 7/2003 |
| WO | WO 03/084292 | 10/2003 |
| WO | WO 03/085700 | 10/2003 |

OTHER PUBLICATIONS

Alivisatos, "Perspectives on the Physical Chemistry of Semiconductor NanoCrystals," J. Phys. Chem. 100, pp. 13226-13239 (1996).

Argazzi et al., "Light-Induced Charge Separation Across Ru(II)-Modified Nanocrystalline TiO₂ Interfaces with Phenothiazine Donors," J. Phys. Chem. B., 101(14), pp. 2591-2597 (1997).

Barbé et al., "Nanocrystalline Titanium Oxide Electrodes for Photovoltaic Applications," Journal of the American Ceramic Society 80(12), pp. 3157-3171 (1997).

Bard, "Spectral Sensitization of the Heterogeneous Photocatalytic Oxidation of Hydroquinone in Aqueous Solutions at Phthalocyanine-Coated TiO₂ Powders," American Chemical Society 101, pp. 6139-6140 (1979).

Bjork et al., "One-dimensional steeplechase for electrons realized," Nano Letters 2, pp. 86-90 (2002).

Bonhôte et al., "Efficient Lateral Electron Transport Inside a Monolayer of Aromatic Amines Anchored on Nanocrystalline Metal Oxide Films," J. Phys. Chem B. 102(9), pp. 1498-1507 (1998).

Bonhte et al., "Long-Lived Photoinduced Charge Separation and Redox-Type Photochromism on Mesoporous Oxide Films Sensitized by Molecular Dyads," J. Am. Chem. Soc. 121(6) pp. 1324-1336 (1999).

Borgarello et al., "Sustained Water Cleavage by Visible Light," Journal American Society 103, pp. 6324-6329 (1981).

Byung et al., "Ultrathin Single-Crystalline Silver Nanowire Arrays Formed in an Ambient Solution Phase," Science 294, pp. 348-351; published online Sep. 6, 2001.

Cao et al., "Growth and properties of semiconductor core/shell nanocrystals with InAs cores," J. Am. Chem. Soc. 122, pp. 9692-9702 (2000).

Colvin et al., "Light Emitting Diodes Made from Cadmium Selenide Nanocrystals and a Semiconducting Polymer," Nature 370, pp. 354-357 (1994).

Cui et al., "Diameter-controlled synthesis of single-crystal silicon nanowires," Appl. Phys. Lett. 78, pp. 2214-2216 (2001).

Cui et al., "Doping and electrical transport in silicon nanowires," J. Phys. Chem. B 104, pp. 5213-5216 (2000).

Dabbousi et al. "(CdSe)ZnS core-shell quantum dots: Synthesis and characterization of a size series of highly luminescent nanocrystallites," J. Phys. Chem. B 101, pp. 9463-9475 (1997).

Dabbousi et al., "Electroluminescence from CdSe quantum-dot/polymer composites," Appl. Phys. Lett. 66(11), pp. 1316-1318 (1995).

Danek et al. "Synthesis of Luminescent Thin-Film CdSe/ZnSe Quantum Dot Composites Using CdSe Quantum dots Passivated with an Overlayer of ZnSe," Chem. Mater 8(1), pp. 173-180 (1996).

Diehl, "Fraunhofer LUCOLEDs to replace lamps," III-Vs Rev. 10(1) (1997).

Duan et al., "General synthesis of compound semi-conductor nanowires," Adv. Mater. 12, pp. 298-302 (2000).

Empedocles et al., "Photoluminescence Spectroscopy of Single CdSe nanocrystallite Quantum Dots," Phys. Rev. Lett. 77(18), pp. 3873-3876 (1996).

Empedocles et al., "Quantum-Confined Stark Effect in Single CdSe nanocrystallite Quantum Dots," Science 278, pp. 2114-2117 (1997).

Fan et al., "Rapid prototyping of patterned functional nanostructures," Nature 405, pp. 56-60 (May 2000).

Gebeyehu et al., "Solid-State Organic/inorganic Hybrid Solar Cells Based on Conjugated Polymers and Dye-Sensitized TiO₂ Electrodes," Thin Solid Films 403-404, pp. 271-274 (2002).

Gebeyehu, et al., "Hybrid Solar Cells based on dye-sensitized nanoporous TiO₂ electrodes and conjugated polymers as hole transport materials," Synthetic Metals 123, pp. 279-287 (2002).

Gewirth et al. with Dukovic (Ed.), "Hot Topics in Electrodisposition," The Electrochemical Society Interface, Spring 1998.

Granstrom et al., "Laminated fabrication of polymeric photovoltaic diodes," Nature 395, pp. 257-260 (Sep. 1998).

Gratzel et al., "Integrated Systems for Water Cleavage by Visible Light: Sensitization of TiO₂ Particles by Surface Derivation with Ruthenium Complexes," Helvetica Chimica Acta 67, pp. 1012-1118 (1984).

Gratzel et al., "Photosensitized Electron Injection in Colloidal Semiconductors," Journal American Chemistry Society 106, pp. 6557-6564 (1984).

Gratzel et al., "Sensitization of TiO₂ in the Visible Light Region Using Zinc Porphyrins," American Chemical Society 91, pp. 2342-2347 (1987).

Green et al., "Solar Cell Efficiency Tables (version 11)," Proges in Photovoltaics: Research and Applications 6, pp. 35-42 (1998).

Greenham et al., "Charge separation and transport in conjugated-polymer/semiconductor-nanocrystal composites studied by photoluminescence quenching and photoconductivity," Phys. Rev. B. 54(24), pp. 17628-17637 (1996).

Gudiksen et al., "Diameter-selective synthesis of semiconductor nanowires," J. Am. Chem. Soc. 122, pp. 8801-8802 (2000).

Gudiksen et al., "Growth of nanowire superlattice structures for nanoscale photonics and electronics," Nature 415, pp. 617-620 (2002).

Gudiksen et al., "Synthetic control of the diameter and length of single crystal semiconductor nanowires," J. Phys. Chem. B 105, pp. 4062-4064 (2001).

Guda et al., "Hybrid organic-inorganic semiconductor-based light-emitting diodes," J. Appl. Phys. 82(8), pp. 4126-4128 (1997).

Halls et al., "Efficient Photodiodes from interpenetrating Polymer Networks," Nature 376 (Aug. 1995).

Heeger, "Semiconducting and metallic polymers: the fourth and fifth generation of polymeric materials," Synthetic Metals 125, pp. 23-42 (2002).

Hines et al. "Synthesis and Characterization of Strongly Luminescing ZnS-Capped CdSe Nanocrystals," J. Phys. Chem. 100, pp. 468-471 (1996).

Holmes et al., "Control of Thickness in Orientation of Solution-Grown Silicon Nanowires," Science 287, pp. 1471-1473 (Feb. 2000).

Hooper et al., "A Highly Conductive Solid-State Polymer Electrolyte Based on a Double-Comb Polysiloxane Polymer with Oligo(ethylene oxide) Side Chains," Organometallics 18(17) (Aug. 1999).

Huang et al., "Ag Nanowire Formation within Mesoporous Silica," Chem. Commun., pp. 1063-1064 (2000).

Huang et al., "Directed Assembly of One-Dimensional Nanostructures Into Functional Networks," Science 291(5504), pp. 630-633 (2001).

Huynh et al., "CdSe Nanocrystal Rods/Poly(3-hexylthiophene) Composite Photovoltaic Devices," Adv. Materials 11(11), pp. 923-927 (1999).

Huynh et al., "Hybrid Nanorod-Polymer Solar Cells," Science 295(5564), pp. 2425-2427 (Mar. 2002).

Hu et al., "Linearly polarized emission from colloidal semiconductor quantum rods," Science 292, pp. 2060-2063 (2001).

Jun et al., "Controlled synthesis of multi-armed CdS nanorod architectures using monosurfactant system," J. Am. Chem. Soc. 123, pp. 5150-5151 (2001).

Kortan et al., "Nucleation and Growth of CdSe on ZnS Quantum Crystallite Seeds and Vice Versa, in Inverse Micelle Media," J. Am. Chem. Soc. 112, pp. 1327-1332 (1990).

Kuno et al., "The band edge luminescence of surface modified CdSe nanocrystallites: Probing the Luminescing state," J. Chem. Phys. 106(23), pp. 9869-9882 (1997).

Lawless et al., "Bifunctional Capping of CdS Nanoparticles and Bridgin to TiO₂," J. Phys. Chem. 99, pp. 10329-10335 (1995).

Lee et al., "Full color Emission from II-VI Semiconductor Quantum Dot-Polymer composites," Adv. Mater. 12(15), pp. 1102-1105 (2000).

Li et al., "Band gap variation of size- and shape-controlled colloidal CdSe quantum rods," Nanoletters 1, pp. 349-351 (2001).

Li et al, "Semiconductor nanorod liquid crystals," Nano Letters 2, pp. 557-560 (2002).

Liu et al., "Sol-Gel Synthesis of Free-Standing Ferroelectric Lead Zirconate Titanate Nanoparticles," J. Am. Chem. Soc. 123, p. 4344 (2001).

Lu et al., "Continuous formation of supported cubic and hexagonal mesoporous films by sol-gel dip-coating," Nature 389 (Sep. 1997).

Lu et al., "Self-Assembly of Mesoscopically Ordered Chromatic Polydiacetylene Nanocomposites," Nature 410, pp. 913-917 (2001).

Manna et al., "Epitaxial growth and photochemical annealing of graded CdS/ZnS shells on Colloidal CdSe nanorods," J. Am. Chem. Soc. 124, pp. 7136-7145 (2002).

Manna et al., "Synthesis of Soluble and Processable Rod-,Arrow-, Teardrop-, and Tetrapod-Shaped CdSe Nanocrystals," J. Am. Chem. Soc. 122, pp. 12700-12706 (2000).

Mapes et al., "Ionic Conductivities of Poly(siloxane) Polymer Electrolytes with Varying Length of Linear Ethoxy Sidechains, Different Molecular Weights, and Mixed Copolymers," Polymer Preprints41(1), pp. 309-310 (2000).

Matsumoto, "Preparation of Monodisperse CdS Nanocrystals by Size Selective Photocorrosion," J. Phys. Chem. 100(32), pp. 13781-13785 (1996).

Merriam Webster Online Dictionary entry for "include" [online], [retrieved on Jun. 14, 2004]. Retrieved from the Internet, <URL: http://www.m-w.com/cgi-bin/dictionary-?book=Dictionary &va=include>.

Merriam Webster Online Dictionary entry for "template" [online], [retrieved on Jul. 16, 2004]. Retrieved from the Internet, <URL: http://www.m-w.com/cgi-bin/dictionary-?book=Dictionary &va=template>.

Morales et al., "A laser ablation method for the synthesis of crystalline semiconductor nanowires," Science 279, pp. 208-211 (1998).

Mosurkal et al., "Rod-like Dinuclear Ruthenium Complexes for Dye-sensitized Photovoltaics," Mat. Res. Soc. Symp. Proc. 708, pp. 367-373 (2002).

Murray et al., "Synthesis and Characterization of Nearly Monodisperse CdE (E=S, Se, Te) Semiconductor Nanocrystallites," J. Am. Chem. Soc. 115, p. 8706 (1993).

Nazeeruddin et al., "Conversion of Light to Electricity by cis-$X_2$Bis(2,2'-bipyridyl-4,4'-dicarboxylate) ruthenium(II) Charge-Transfer Sensitizer (X = $Cl^-$, $BR^-$, $I^-$, $CN^-$, and $SCN^-$) on Nanocrystalline $TiO_2$ Electrodes," Journal of the American Chemical Society 115, pp. 6382-6390 (1993).

Nirmal et al., "Fluorescence Intermittency in single Cadmium Selenide Nanocrystals," Nature 383, pp. 802-804 (1996).

Nguyen et al., "Control of Engery Transfer in Oriented Conjugated Polymer-Mesoporous Silica Composites," Science 288, pp. 652-656 (Apr. 2000).

O'Regan et al, "A Low-Cost, High-Efficiency Solar Cell Based on Dye-Sensitized Colloidal $TiO_2$ Films," Nature 353, pp. 737-739 (1991).

Patent Cooperation Treaty (PCT) International Search Report, International Application No. PCT/US03/02094, Sep. 23, 2003.

Peng et al., "Epitaxial growth of highly luminescent Cd/Se/CdS core/shell nanocrystals with photostability and electronic accessibility," J. Am. Chem. Soc. 119, pp. 7019-7029 (1997).

Peng et al., "Shape control of CdSe nanocrystals," Nature 404, pp. 59-61 (2000).

Puntes et al., "Colloidal nanocrystal shape and size control: The case of cobalt," Science 291, pp. 2115-2117 (2001).

Saloniemi, "Electrodeposition of PbS, PbSe and TbTe Thin Films," VTT Publications 423 (Dec. 2000), an electronic copy of which may be accessed at http://www.inf.vtt.fi/pdf/publications/2000/P423.pdf.

Scher et al., "Shape Control and Applications of Nanocrystals," Philosophical Transactions of the Royal Society London, Series A. 361, pp. 241-257 (2003).

Schlamp et al., "Improved efficiencies in light emitting diodes made with CdSe(CdS) core/shell type nanocrystals and a semiconducting polymer," J. Appl. Phys. 82, pp. 5837-5842 (1997).

Schmidt-Mende et al., "Self-Organized Discotic Liquid Crystals for High-Efficiency Organic Photovoltaics," Science 293, pp. 1119-1122 (Aug. 2001).

Sellinger, et al., "Continuous self-assembly or organic-inorganic nanocomposite coatings that mimic nacre," Nature 394, pp. 256-260 (Jul. 1998).

Smestad et al., "A technique to compare polythiophene solid-state dye sensitized $TiO_2$ solar cells to liquid junction devices," Solar Energy Materials & Solar Cells (2002).

Tennakone et al., "A Dye-Sensitized Nano-Porous Solid-State Photo Voltaic Cell" Semiconductor Science and Technology 10, pp. 1689-1693, IOP Publishing, UK 1995.

U.S. Appl. No. 10/405,914 filed Apr. 1, 2003 to Empedocles et al.

U.S. Appl. No. 10/319,406 entitled "Nano-Architected/Assembled Solar Electricity Cell" to Sager et al., filed Dec. 11, 2002.

U.S. Appl. No. 10/290,119, entitled "Optoelectronic Devices and Fabrication Methods" to Sager et al., filed Nov. 5, 2002.

U.S. Appl. No. 10/303,665, entitled "Molding Technique for Fabrication of Optoelectronic Devices," to Roscheisen et al., filed Nov. 22, 2002.

Urban et al., "Synthesis of single-crystalline perovskite nanowires composed of barium titanate and strontium titanate," J. Am. Soc. 124, p. 1186 (2002).

Wu et al., "Block-by-block growth of single-crystalline Si/SiGe superlattice nanowires," Nano Letters 2, pp. 83-86 (2002).

Yun et al., "Ferroelectric Properties of Individual Barium Titanate Nanowires Investigated by Scanned Probe Microscopy," Nanoletters 2, p. 447 (2002).

* cited by examiner

US 7,341,774 B2

ELECTRONIC AND OPTO-ELECTRONIC DEVICES FABRICATED FROM NANOSTRUCTURED HIGH SURFACE TO VOLUME RATIO THIN FILMS

This application is a continuation-in-part application of U.S. Nonprovisional Application Ser. No. 10/165,858 (now U.S. Pat. No. 6,919,119 entitled "ELECTRONIC AND OPTO-ELECTRONIC DEVICES FABRICATED FROM NANOSTRUCTURED HIGH SURFACE TO VOLUME RATIO THIN FILMS" filed on Jun. 8, 2002, which claims priority from U.S. Provisional Application No. 60/296,857, filed Jun. 8, 2001 and U.S. patent application, Ser. No. 10/144,456, filed on May 13, 2002, which is a Continuation-In-Part of U.S. patent application, Ser. No. 10/104,749, filed on Mar. 22, 2002, which is a Continuation of U.S. patent application, Ser. No. 09/580,105, filed on May 30, 2000, now U.S. Pat. No. 6,399,177.

BACKGROUND OF THE INVENTION

1. Field of the Invention

The present invention generally relates to a novel production method for the production of electronic and opto-electronic devices from an interpenetrating network configuration of nano structured high surface to volume ratio porous thin films with organic/inorganic metal, semiconductor or insulator material positioned within the interconnected void volume of the nano structure.

2. Description of the Prior Art

Today nanoparticles are proposed for, and used for, providing a high surface area to volume ratio material. Besides the large surface area they provide, nanoparticles can be embedded in organic/inorganic semiconductor/insulator materials (nano composite systems) to obtain a high interface area that can be exploited in, for example, the following optoelectronic and electronic applications: (a) charge separation functions for such applications as photovoltaics and detectors; (b) charge injection functions for such applications as light emitting devices; (c) charge storage functions for capacitors; and (d) ohmic contact-like functions for such applications as contacting molecular electronic structures.

There are difficulties with nanoparticles, however. These include their handling and, for electronic and opto-electronic uses, they also include the question of how to achieve electrical contact. The present invention solves these two problems by using deposited nanostructured high surface to volume ratio materials. These materials allow a manageable high interface area which is easily contacted electrically.

In the present approach for making optoelectronic devices from nanoparticle composite systems isolated nanoparticles are diffused into a matrix of organic material. Ideally, each nanoparticle or nanoparticle surface must be electrically connected to the outside (by a set of electrodes) for electrical and opto-electronic function. This is best achieved if the nanoparticles are arranged so that they are interconnected to the electrodes providing continuous electrical pathways to these particles. However, in the present art with the use of isolated nanoparticles, these particles will often fail to make good electrical contacts even if the volume fraction of nanoparticles is made close to unity.

In this invention a different approach is proposed to avoid this problem. This approach involves formation of a thin film of a nanostructured high surface area to volume ratio material on an electrode substrate or a patterned set of electrodes on a substrate. The basic elements (building blocks) of this nanostructure are embedded in an interconnected void matrix with the attributes of high surface to volume ratio but with electrical connectivity to the substrate electrode. Once the interconnected void network of this film material is filled with a secondary material a composite is formed with high interface area. Furthermore, each component of the composite structure is conformally connected. Hence, any region of the composite system including the interface has continuous electrical connection to the outside.

SUMMARY OF THE INVENTION

A method of fabricating an electronic/optoelectronic device from an interpenetrating network of a nanostructured high surface area to volume ratio material and an organic/inorganic matrix material comprising the steps of: a) obtaining a high surface area to volume ratio film material onto an electrode substrate (or a patterned electrode substrate), such that any region of this film material is in electrical connectivity with the electrode substrate by virtue of the morphology. For example, the film material may comprise an array of nano and/or micro-protrusions electrically connected to the electrode substrate and separated by a void matrix; b) filling the void matrix of the high surface to volume film with an organic/inorganic solid or liquid material; and c) defining an electrode or set of electrodes onto the organic or inorganic intra-void material embedded in said void matrix.

The basic elements of the high surface area to volume film material can be selected from the group consisting of: nanotubes, nanorods, nanowires, nanocolumns or aggregates thereof, oriented molecules, chains of atoms, chains of molecules, fullerenes, nanoparticles, aggregates of nanoparticles, and any combinations thereof.

The organic/inorganic intra-void material is at least one selected from the group consisting of: organic semiconductor material, organic insulator material, inorganic semiconductor material, inorganic insulator material, conjugated polymers, metals, organometallics, self assembling molecular layers and any combinations thereof.

The high surface area to volume porous film is preferably deposited onto the conductive (electrode) substrate or on a patterned substrate by, for example, chemical vapor deposition, plasma-enhanced chemical vapor deposition, physical vapor deposition, or electrodeposition. Or it may be obtained by electrochemical etching.

The organic or inorganic intra-void material may be applied into the void matrix in liquid form, molten form, as dissolved in a solvent, or by electrochemical means. Additionally, the intra-void material may be embedded into the void matrix by exposing the film material to the vapor of the intra-void material, thus causing the vapor to condense inside the void matrix.

The interpenetrating network of nanostructured high surface area to volume ratio material and intra-void material may be used for fabricating a charge separation and collection device such as a chemical sensor, photodetector or a photovoltaic device.

The network may also be used for fabricating a charge injection device such as an electroluminescent device.

The interpenetrating network of nanostructured high surface area to volume ratio material and organic/inorganic intra-void material may also be used for fabricating a charge storage device (capacitor).

The nanostructured high surface area to volume ratio material may also be used as an ohmic-like contact to the intra-void material.

The interpenetrating network of nanostructured high surface area to volume ratio material and intra-void material may further be used to fabricate an electronic device in which the electronic current through the nano-scale basic elements of the film (charge transport paths) are regulated by the electric potential applied to the filling material surrounding the nano-scale basic elements or vice versa. This electronic device functions as a field effect-type transistor.

Other features and advantages of the present invention will be apparent from the following detailed description and from the claims.

DETAILED DESCRIPTION OF THE INVENTION

The present invention is directed to a method for fabricating an interpenetrating network of a nanostructured high surface area to volume ratio material and an organic or inorganic intra-void material comprising: a) obtaining a high surface area to volume ratio film material onto an electrode substrate (or a patterned electrode substrate), such that any region of this film material is in electrical connectivity with the electrode substrate by virtue of the morphology. For example, the film material may comprise an array of nano and/or micro-protrusions electrically connected to the electrode substrate and separated by a void matrix; b) filling the void matrix of the high surface to volume film with an organic/inorganic solid or liquid material; and c) defining an electrode or set of electrodes onto the organic or inorganic intra-void material embedded in said void matrix.

The basic elements of the high surface area to volume film material can be selected from the group consisting of: nanotubes, nanorods, nanowires, nanocolumns or aggregates thereof, oriented molecules, chains of atoms, chains of molecules, fullerenes, nanoparticles, aggregates of nanoparticles, and any combinations thereof. The basic elements of the high surface area to volume film comprises a material selected from the group consisting of: silicon, silicon dioxide, germanium, germanium oxide, indium, gallium, cadmium, selenium, tellurium, and alloys and compounds thereof, carbon, hydrogen, semiconductors, insulators, metals, ceramics, polymers, other inorganic material, organic material, or any combinations thereof.

The organic/inorganic filling material may comprise a semiconductor, an insulator, a metal, an organometallic, a self assembling molecular layer, a conjugated polymer, and any combinations thereof.

The high surface area to volume porous film is preferably deposited onto the conductive (electrode) layer substrate or on a patterned substrate by, for example, chemical vapor deposition, plasma-enhanced chemical vapor deposition, physical vapor deposition, or electrodeposition. Or it may be obtained by electrochemical etching.

The organic or inorganic intra-void material may be applied into the void matrix in liquid form, molten form as dissolved in a solvent, or by electrochemical means. Additionally, the intra-void material may be embedded into the void matrix by exposing the film material to the vapor of the intra-void material, thus causing the vapor to condense inside the void matrix.

Figure 1:
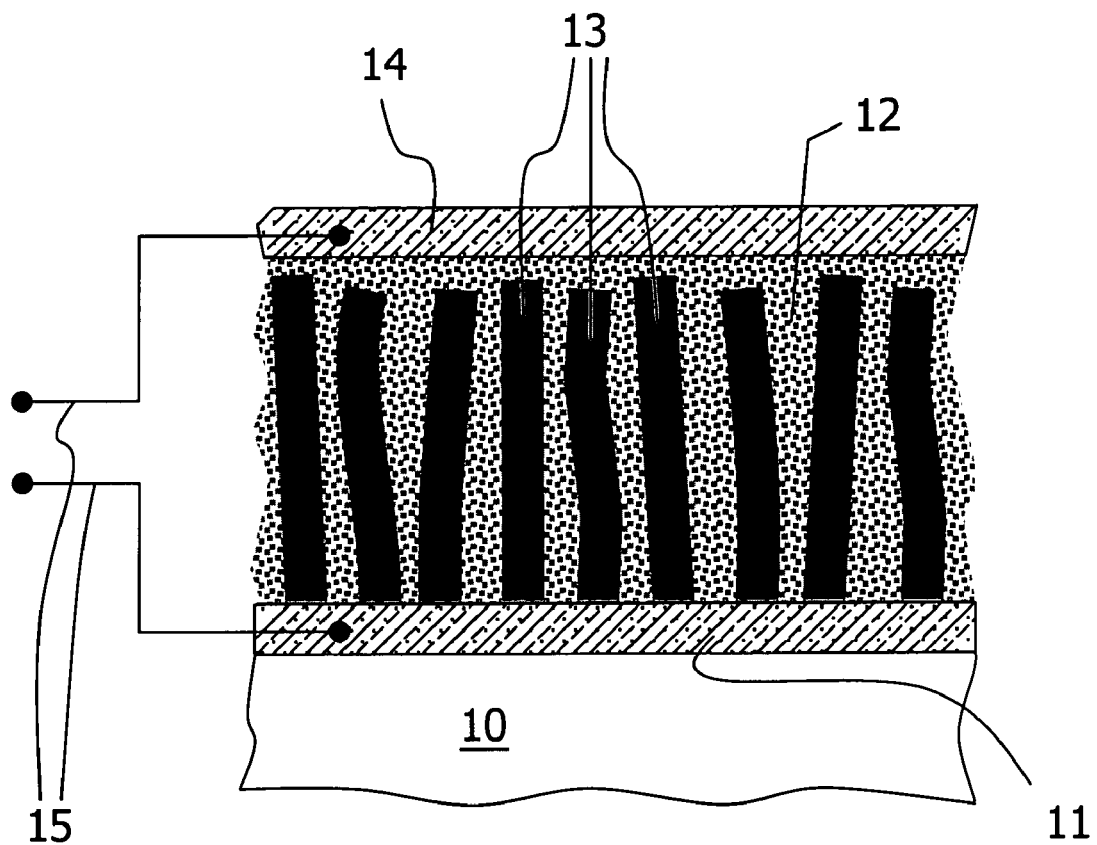
FIG. 1 is an electronic/optoelectronic device fabricated from an interpenetrating network of a nanostructured thin film and an organic semiconductor/insulator material with a large interface.

Referring now to FIG. 1, there is shown a schematic representation of an electronic or opto-electronic device. The device is fabricated from an interpenetrating network of a nanostructured thin film and a metal, semiconductor, or insulator material forming a large interface area. The high surface to volume thin film material consisting of an array of nano-protrusions 13 separated by voids is first formed on a conductive substrate or a conductive layer 11 on a substrate 10 (electrode). Here, the basic elements of the high surface to volume film are nano-protrusions as an example. However various other morphologies are possible as long as the nano-scale basic elements each have a continuous charge conduction path to the substrate electrode. Then the void volume is filled with an appropriate organic/inorganic metal, semiconductor or insulator inter-void material 12. Finally, an appropriate electrode 14 (or set of electrodes) is defined onto the inter-void material. Thereby each material (nano-protrusions and matrix) is conformally connected to its own electrode. Contacts to electrodes 15 provide connection to the outside world.

Figure 2:
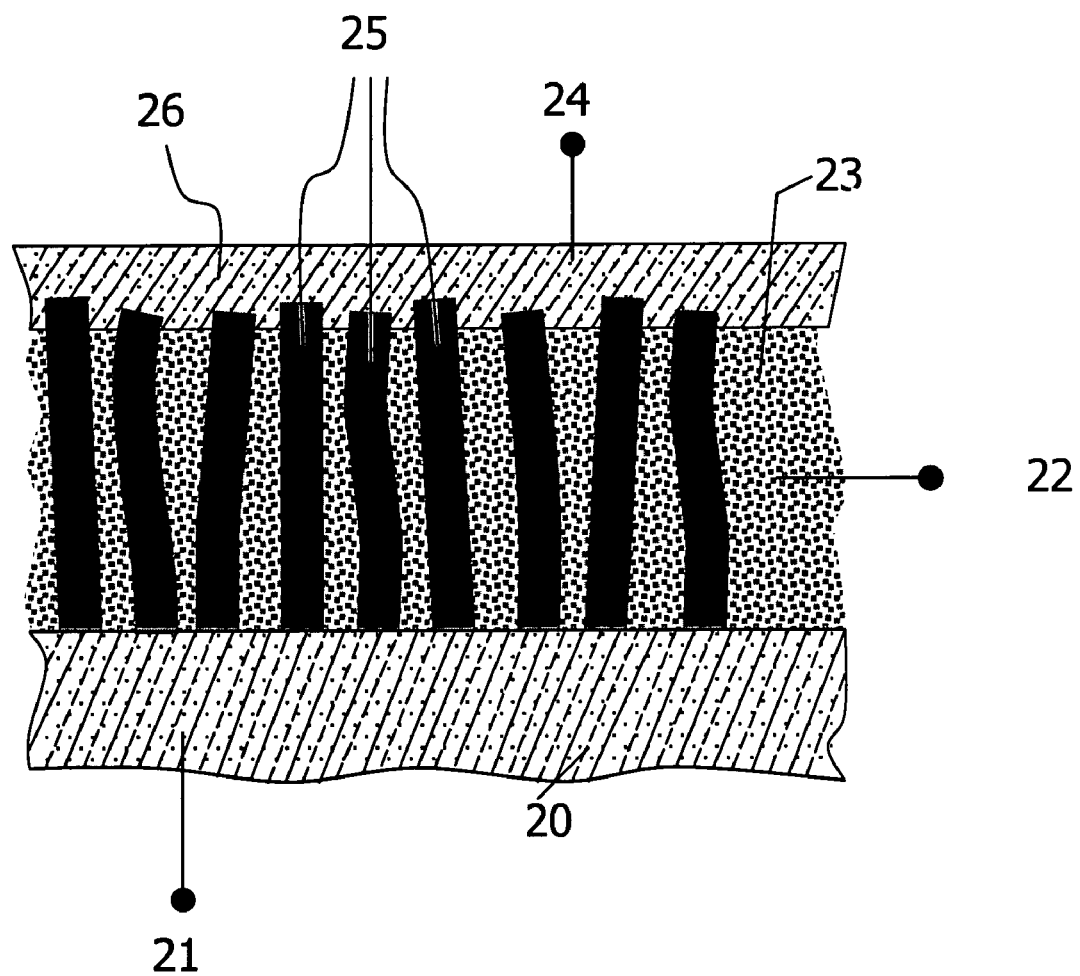
FIG. 2 is a field effect device according to the present invention.
Figure 3:
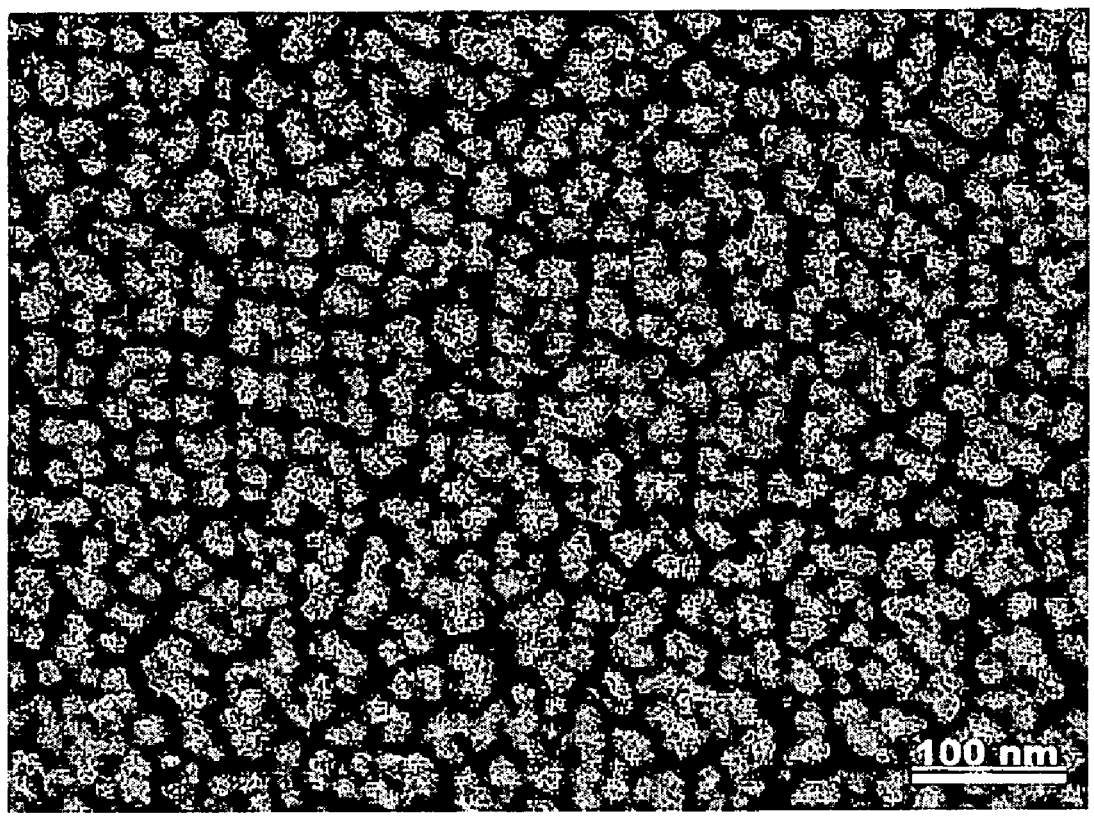
FIG. 3 is a scanning electron microscope view of a nanostructured high surface to volume column void network Si film deposited by high density plasma on a highly conductive (approximately 100 S/cm)<100>Si substrate. The film was grown at 10 mTorr, 100.degree. C., 400 W, using 40 sccm $H_2$ and 2 sccm $SiH_4$ for 10 minutes.

Referring to FIG. 2, a wafer (p+Si) 20 is a source (+) 21. Al 26 is a drain (0) 24. Tri-p-tolylamide 23 provides a gate (−) 22. Silicon nano-protrusions (n-type) 25 are shown in this embodiment.

In the devices of the present invention, the nanostructured film material is a comprised of nano-scale basic elements each with the attributes of (1) high surface to volume ratio and (2) electrical connectivity to the substrate electrode. The nano-scale basic elements (e.g., nanowires, nanocolumns, etc.) are separated by voids, or equivalently they are embedded in an interconnected void matrix. FIG. 1 illustrates an example where the film consists of an array of protruding nanocolumns, nanowires, or nanotubes aligned nearly perpendicular to the substrate electrode. These nano-building-elements can also be in clusters of sub-elements (e.g., nanoparticles, nanofibers, etc.) that form various nanostructures such as regular nanocoiumn or nanowire arrays or fractal coral-like morphologies. Or, each element can be in the form of a single nanotube or nanowire or a chain of atoms/molecules (i.e., oriented giant molecules). In one embodiment a device of the present teachings includes a conductive layer a porous organic or inorganic material forming a continuous nanostructured material, the conductive layer in substantial contact with the continuous nanostructured material, a nanostructured material substantially embedded in at least one ore of the continuous nanostructured material such that nano-scale elements of the embedded material are arrayed to cause charge separation, charge injection or charge storage at or near an interface between the continuous nanostructured material and the embedded nano-scale elements and another conductive layer in substantial electrical contact with the embedded nano-scale elements.

In the approach of this invention, after the formation of the film of nano-scale elements, the organic/inorganic based appropriate semiconductor, metal or insulator intra-void material can be introduced into the void matrix. Here, the intra-void material can be applied into the high surface to volume film in liquid form, molten, as dissolved in a solvent or by electrochemical means. Furthermore, the intra-void material can be filled into the voids by exposing the high surface to volume film to the vapor of the intra-void material and subsequent capillary condensation of the vapor inside the voids. Once the intra-void material occupies the void network inside the solid porous film, it forms a nanostructured network. Hence each material interpenetrates each other with a nanostructured network creating a large interface area.

To complete the fabrication of a chemical sensor, electronic or opto-electronic device, a step finally defining an appropriate electrode to the intra-void material would be undertaken. Thus, the resulting composite nanostructure consists of an interpenetrating network of a nanostructured thin film and a metal/semiconductor/insulator material with a large interface. In this approach of this invention, each material (high surface to volume film and intra-void material) is conformally connected to its own electrode. A representative illustration of this approach is given in FIG. 1.

The invention is further illustrated by the following examples which are intended for illustration and not for limitation of the scope thereof.

EXAMPLE 1

Charge Separation and Photovoltaics

Organic semiconductor materials are also called molecular semiconductors since the building blocks are single organic molecules or conjugated polymer molecules. In molecular semiconductors, photoexcitation creates electron-hole pairs which are strongly bound (e.g., approximately 0.4 eV in poly(p-phenylenevinylene)). Charge collection requires the separation of electron and hole into free carriers.

An exciton (electron-hole pair) can efficiently be split at interfaces between materials with different electron and hole affinities and ionization potentials, where electron is captured by the higher electron affinity side and hole by the lower hole affinity side. Unfortunately, the lifetime of exciton is short (100-1000 ps), so only excitons created within approximately 10 nm of the interface will ever reach it. Accordingly, charge collection directly scales with the interface area, which must be large per unit of light penetrating cross sectional area. Furthermore, optimum charge collection occurs if continuous conduction pathways are provided to the electrodes for electrons and holes from the interfaces, where they are separated.

Hence, an efficient charge separation and collection device may be fabricated from interpenetrating nanostructured thin films and organic semiconductors. For example, the high electron affinity difference between inorganic semiconductors (approximately 4 eV) and most organic semiconductors (approximately 3 eV) ensures efficient charge separation at the interface as long as the band gap of the inorganic semiconductor is not smaller than that of the organic semiconductor by the electron affinity difference. Furthermore, the nanostructured thin film/organic interface will provide an interconnected and extremely large surface for efficient charge photogeneration, separation and collection.

The interpenetrating network of both inorganic and organic will provide continuous conduction pathways for electrons and holes to the electrodes. Also, if such a structure is operated with the two electrodes biased, the device will also function as a photodetector. If such a structure is operated under bias and if it is penetrated by adsorbed species, the device will function as a sensor if such penetration changes the device response.

Our approach of a thin film of protrusions (of nanoparticles or clusters of nanoparticles) with high surface to volume ratio has many advantages over the use of individual nanoparticles, as is practiced in the art. For example, Greenham et al. have reported a photovoltaic device based on CdSe nanocrystals embedded in a matrix of a semiconductor polymer, poly(2-methoxy,5-(2'-ethyl-hexyloxy)-p-phenylenevinylene). Both materials are semiconductors with bandgaps of about 2 eV, but the electron affinity of the nanocrystals is much greater than that of the polymer. As a result, electron-hole pairs generated by photons (either in the nanocrystals or the polymer) rapidly separate with the hole residing on the polymer and the electron on the nanocrystals. Then, free holes move along the polymer phase (diffusion or drift), while free electrons hop (tunnel) from nanocrystal to nanocrystal until they are collected at electrodes.

In this device, the mechanism of electron transport being tunneling between nanocrystals (i.e., effectively a slow process) limits the collection efficiency of electrons. Slow transport of electrons also increases their probability of recombining with holes before being collected. As a result of this poor carrier collection, the highest quantum efficiency achievable with this discrete nanoparticle approach was only around 12% (i.e., 12% at 514 nm).

On the other hand, if the nanocrystals have continuous electrical conduction pathways down to the electrode as proposed in this invention, transport of electrons will not involve tunneling, and they will be transported efficiently by drift or diffusion from where they are photogenerated to where they are collected. Consequently, a higher quantum efficiency can be achieved.

EXAMPLE 2

Charge Injection and Light Emitting Devices

An attractive feature associated with the large interface formed by interpenetrating network of nanostructured thin films and organic/inorganic semiconductors is that a very effective electrical contact can be made between the nanostructured film material and the intra-void material. Therefore, light emitting devices can be designed based on efficient carrier injection and subsequent radiative recombination or based on carrier excitation.

On the other hand, the electron affinity or the hole affinity difference between the two materials at the interface may not be in favor of charge injection and rather impede the transport. In this situation, a high band gap layer (e.g., silicon oxide, silicon nitride), which is thin enough (i.e., 20-60 .ANG.) for carriers to tunnel can be placed at the interface. Since the voltage drop and band bending will mostly occur across this high band-gap layer, the conduction band edge (or the valence band edge) of the film material can be aligned with the lowest unoccupied molecular orbital (or the highest occupied molecular orbital) of the organic semiconductor material enabling an efficient carrier injection (i.e., by tunneling through the high band-gap material).

EXAMPLE 3

Charge Capacitors

Two conducting nanostructured layers can be made to sandwich an insulating layer to form a charge capacitor with a high capacitance due to the high surface area of the two layers (electrodes). In this application, the insulating layer should be thin enough to enable electric fields at highly oblique angles between the two electrode surfaces so that the effective capacitor area is close to that of the interface. However, the insulating layer should also be thick enough to prevent significant charge (current) leakage across electrodes.

A variety of structures can be considered to fabricate such a capacitor device with the approach of this invention. As an example, the following procedure can be taken: (1) deposition of a highly conductive and porous nanostructured Si thin film with an interconnected void volume (first electrode), (2) coating of the inner surface of the Si film with an oxide by oxidation (i.e., thermal, anodic, or plasma oxidation) or by molecular self-assembly (insulating layer), and (3) filling the void volume with a high conductivity organic semiconductor material conformally covering the oxide surface (second electrode). An organometallic can also be used instead of the organic semiconductor material with a further step of annealing to convert it to a metal.

Additionally, only one of the electrodes could be made to have nanostructured surface (high surface area). This can simply be obtained as follows: after the step (1) as above, the void volume of the film material can be filled with an organic insulator, which will planarize the film surface. Then a planar conductive layer is deposited on the organic layer as the second electrode. Furthermore, the deposited nanostructured porous film can be an insulator deposited on an electrode, or can be made an insulator after deposition by further processing (e.g., Si can be oxidized to obtain SiO.sub.2). Then a conductive organic material can be applied on the insulating film filling the void volume to generate the second electrode, which will be nanostructured and with a large surface area.

EXAMPLE 4

Ohmic-Like Contacts

The nanostructured high surface to volume films of this invention are ideal for forming ohmic-like contacts to materials systems, in general. This is because their high surface allows many points for carrier transfer. In addition the high field that can exist at the nano-scale features of these films can give rise to locally very high electric fields and to tunneling. This ohmic contact role of these films can be combined with their ability to affix molecules to allow our films to serve as ohmic contacts in molecular electronics. This affixing and electrical contacting of molecules can be forced to take place in prescribed locations by patterning techniques and masking.

EXAMPLE 5

Field Effect Devices

A field effect device can be fabricated from the composite nanostructure described in this invention wherein the electric current through said nanoprotrusions of the porous film is regulated by varying the electric potential of the intra-void material surrounding the nanoprotrusions. In this case, the nanoprotrusions must be connected to a second electrode in addition to the electrode at their base for the flow of electric current and therefore the resulting device consists of three electrical contacts. Therefore, the nanoprotrusions serve as the channel and the electrodes they are connected to as source and drain, whereas at least a portion of the intra-void material serves as the gate of this field effect transistor. While at least a portion of the intra-void material must be a good electrical conductor (gate), any currents between the gate and channel, source or drain will be leakage currents and therefore must be minimized. This can be achieved by isolating the conducting intra-void material from other regions with a high band-gap material layer at the interfaces. For example, if the nano-protrusions are Si, their surface may be oxidized to insulate them from the filling material (gate) with an interfacial silicon oxide layer. Alternatively, self assembling molecules can be attached to the interface to serve as the required insulator layer. Another approach would be to use a highly doped high band-gap material for the filling material (gate). This will ensure a uniform electric potential throughout the gate material, while the leakage currents will be minimized due to either band offsets or depletion of minority carriers in the gate material. FIG. 2 depicts an example device with Si nanoprotrusions and tri-p-tolylamine, a highly doped high band-gap material, as the filling material (gate). Here when the gate is negatively biased it will invert the Si protrusions to be hole carriers and significantly enhance the hole current from source (p Si) to drain (Al) (turning on the transistor). The leakage hole currents from Si or Al to tri-p-tolylamine will be impeded by the significant differences in ionization potentials at the interfaces (>1 eV). On the other hand, the leakage electron currents from tri-p-tolylamine to Si or Al will be insignificant, since tri-p-tolylamine is a hole transport material and is depleted of electrons.

Although the present invention describes in detail certain embodiments, it is understood that variations and modifications exist known to those skilled in the art that are within the invention. Accordingly, the present invention is intended to encompass all such alternatives, modifications and variations that are within the scope of the invention as set forth in the following claims.

EXAMPLE 6

Chemical Sensors

A structure based on this concept of the electrically contacted high surface to volume film and intra-void material with its electrical contact(s) such as seen in FIG. 1 can also be used as a chemical sensor. Sensing will occur when the species to be detected interact with the intra-void material thereby modifying its electrical or dielectric properties resulting in a change in the ac or dc behavior observed though the electrical contacts.

The nano-scale elements and pores or voids of porous material described in the above embodiments of the present invention can have a characteristic size between 0.3 to 500 nm, and more specifically between 1 to 50 nm.

Although the present invention describes in detail certain embodiments, it is understood that variations and modifications exist known to those skilled in the art that arc within the invention. Accordingly, the present invention is intended to encompass all such alternatives, modifications and variations that are within the scope of the invention as set forth in the following claims.

What is claimed is:

1. An electronic or opto-electronic device comprising:
   a first conductive layer electrode;
   a nanostructured porous material disposed on said first conductive layer electrode such that said nanostructured porous material is in substantial electrical connectivity with said first conductive layer electrode;

an organic or inorganic material substantially embedded into at least one void of said nanostructured porous material such that an interface is substantially formed between said nanostructured porous material and said embedded material; and a second conductive layer electrode in substantial contact with said embedded material, wherein charge separation, charge injection or charge storage occurs at or near said interface.

2. The device according to claim 1, wherein said nanostructured porous material has coral-like morphology.

3. The device according to claim 1, wherein said at least one void of said nanostructured porous material has at least one dimension ranging from about 0.3 to about 500 nm.

4. The device according to claim 1, wherein said device is a photovoltaic device.

5. The device according to claim 1, said device is a light emitting device.

6. An electronic or opto-electronic device comprising:

a conductive layer;

a porous organic or inorganic material forming a porous nanostructure;

said conductive layer in substantial contact with said porous nanostructure;

a nanostructured material substantially embedded in at least one pore of said porous nanostructure such that nano-scale elements of said embedded nanostructured material are arrayed to cause charge separation, charge injection or charge storage at or near an interface between said porous nanostructure and said embedded nano-scale elements; and another conductive layer in substantial electrical contact with said embedded nano-scale elements.

7. The device according to claim 6, wherein said porous nanostructure has coral-like morphology.

8. The device according to claim 6, wherein said embedded nano-scale elements have coral-like morphology.

9. The device according to claim 6, wherein said at least one pore of said porous nanostructure has at least one dimension ranging from about 0.3 to about 500 nm.

10. The device according to claim 6, wherein said embedded nano-scale elements have an approximate size ranging from 1 to 50 nm.

11. The device according to claim 6, wherein said device is a photovoltaic device.

12. The device according to claim 6, said device is a light emitting device.

13. An electronic or opto-electronic device comprising:

a first conductive layer electrode;

a nanostructured high surface area to volume ratio structure disposed on said first conductive layer electrode such that nano-scale elements of said material are separated by voids, said voids defining a void volume;

at least one nano-scale element of said nano-scale elements is in substantial electrical connectivity with said first conductive layer electrode;

an organic or inorganic material substantially filing said void volume such that an interface is substantially formed between said organic or inorganic material and at least one of said nano-scale elements; and a second conductive layer electrode in substantial contact with said organic or inorganic material, wherein charge separation, charge injection or charge storage occurs at said interface.

14. The device according to claim 13, wherein said nanostructured high surface area to volume ratio material has coral-like morphology.

15. The device according to claim 13, wherein said nano-scale elements have coral-like morphology.

16. The device according to claim 13, wherein a void of said void volume has at least one dimension ranging from about 0.3 to about 500 nm.

17. The device according to claim 13, wherein said nano-scale elements have an approximate size ranging from 1 to 50 nm.

18. The device according to claim 13, wherein said device is a photovoltaic device.

19. The device according to claim 13, said device is a light emitting device.

* * * * *